United States Patent
Radhakrishnan et al.

(10) Patent No.: US 9,935,653 B2
(45) Date of Patent: Apr. 3, 2018

(54) ENHANCED CYCLICAL REDUNDANCY CHECK CIRCUIT BASED ON GALOIS-FIELD ARITHMETIC

(71) Applicant: Intel Corporation, Santa Clara, CA (US)

(72) Inventors: Sivakumar Radhakrishnan, Portland, OR (US); Sin S. Tan, Portland, OR (US); Kenneth C. Haren, Portland, OR (US); Mark A. Schmisseur, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/980,201

(22) Filed: Dec. 28, 2015

(65) Prior Publication Data

US 2017/0187389 A1     Jun. 29, 2017

(51) Int. Cl.
*H03M 13/07*     (2006.01)
*H03M 13/09*     (2006.01)

(52) U.S. Cl.
CPC ......... *H03M 13/07* (2013.01); *H03M 13/091* (2013.01)

(58) Field of Classification Search
CPC .. G06F 11/08; G06F 11/1004; G06F 11/1044; G06F 7/724; G06F 11/1076; H03M 13/09; H03M 13/093; H03M 13/07; H03M 13/091
See application file for complete search history.

(56) References Cited

U.S. PATENT DOCUMENTS

| | | | | |
|---|---|---|---|---|
| 6,766,493 B1 * | 7/2004 | Hoffman | ............. | H03M 13/091 708/492 |
| 6,836,869 B1 * | 12/2004 | Wyland | ................. | H03M 13/09 714/781 |
| 8,607,129 B2 | 12/2013 | Radhakrishnan et al. | | |
| 9,141,469 B2 | 9/2015 | Radhakrishnan et al. | | |
| 9,244,762 B1 * | 1/2016 | Geddes | ............... | G06F 11/1076 |
| 9,362,953 B2 * | 6/2016 | Kern | ................... | H03M 13/152 |
| 2013/0007573 A1 | 1/2013 | Radhakrishnan et al. | | |

OTHER PUBLICATIONS

"Ethernets; Clause 4 Media Access Control Test Suite", Technical Document, Mar. 17, 2011, 92 pages, University of New Hampshire InterOperability Laboratory.

(Continued)

*Primary Examiner* — Shelly A Chase
(74) *Attorney, Agent, or Firm* — Alpine Technology Law Group LLC (57) ABSTRACT

Methods and apparatus related to enhanced Cyclical Redundancy Check (CRC) circuit based on Galois-Field arithmetic are described. In one embodiment, a plurality of exclusive OR logic include first exclusive OR logic and second exclusive OR logic. First Galois Field multiplier logic multiplies a first output from the first exclusive OR logic and a first portion of a plurality of portions of the input data. Second Galois Field multiplier logic multiplies a second output from the second exclusive OR logic and a second portion of the plurality of portions of the input data. Other embodiments are also disclosed and claimed.

25 Claims, 10 Drawing Sheets

(56) References Cited

OTHER PUBLICATIONS

Evans "Information Technology—SCSI Block Commands", American National Standard, Jan. 21, 2011, 282 pages, Revision 26, International Committee for Information Technology Standards.

Mark Evans, "Information Technology—SCSI Block Commands", Standard, Jan. 21, 2011, 282 pages, Revision 26, Working Draft Project American National Standard.

Estes, et al., "Ethernets Clause 4, Media Access Control Test Suite", Technical Document, Mar. 17, 2011, 92 pages, Version 5.2, University of New Hampshire, Durham, NH.

* cited by examiner

ENHANCED CYCLICAL REDUNDANCY CHECK CIRCUIT BASED ON GALOIS-FIELD ARITHMETIC

FIELD

The present disclosure generally relates to the field of electronics. More particularly, some embodiments generally relate to enhanced Cyclical Redundancy Check (CRC) circuit based on Galois-Field arithmetic.

BACKGROUND

Data integrity is an important feature for any type of data communication system, including those included in storage devices or systems. Cyclic Redundancy Check (CRC) codes are efficient and effective data integrity tools for error checking. Several methods for calculating CRC and hardware have been proposed. These methods may include bit-serial methods that use Linear Feedback Shift Registers (LFSRs) and parallel CRC methods that utilize lookup tables for CRC computation.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

DETAILED DESCRIPTION

In the following description, numerous specific details are set forth in order to provide a thorough understanding of various embodiments. However, various embodiments may be practiced without the specific details. In other instances, well-known methods, procedures, components, and circuits have not been described in detail so as not to obscure the particular embodiments. Further, various aspects of embodiments may be performed using various means, such as integrated semiconductor circuits ("hardware"), computer-readable instructions organized into one or more programs ("software"), or some combination of hardware and software. For the purposes of this disclosure reference to "logic" shall mean either hardware, software, firmware, or some combination thereof.

As mentioned above, some previously proposed methods for performing CRC computations may include bit-serial methods that use Linear Feedback Shift Registers (LFSRs) and parallel CRC methods that utilize lookup tables for CRC computation. The simplest hardware solution for CRC computation is to use the LFSR, which is a simple bit-serial architecture for both encoding and decoding a message. This approach typically calculates the CRC for an N-bit message in N clock cycles. The basic bit-serial algorithm can be improved by processing a number of bits or bytes up to the width of a CRC polynomial. Some popular algorithms use table lookup to achieve parallelism. Software implementations may use shift-and-add operations.

Furthermore, some processors (such as Xeon® processor provided by Intel® Corporation) may provide an instruction (e.g., PCLMULQDQ) for programmable CRC 16-bit and 32-bit that can be used for T10 CRC (e.g., in accordance with the T10 technical committee of the International Committee on Information Technology Standards (INCITS). The T10 committee is generally responsible for SCSI Storage Interfaces and one principal work done by this committee also includes Small Computer System Interface (SCSI). However, the performance is dependent upon many items such as the number of cores, processor frequency/load, threads, cache size, etc., and the software execution stack. For silicon real-estate and thermally constrained environment, such as in a System On Chip (SOC), hardware (HW) based solutions for CRC computation is desired for applications such as DMA (Direct Memory Access), accelerators, RAID (Redundant Array of Independent Disks), or other IOP (Input/Output Operations Per Second) based storage systems.

To this end, some embodiments relate to enhanced Cyclical Redundancy Check (CRC) circuit based on Galois-Field arithmetic. In an embodiment, the T10 CRC is calculated for any arbitrary data length using a series of parallel Galois Field (GF2) multiplier logic, modulo reduction logic blocks, and specialized data length analysis logic blocks and seed induction to aid in the computation. Further, some embodiments are described herein with reference to the SCSI (Small Computer System Interface) 16-bit CRC polynomial $x16+x15+x11+x9+x8+x7+x5+x4+x2+x+1$ (also referred to as "0x18 BB7") based on GF2 arithmetic. However, it will be understood that the disclosed concepts may be applicable to providing data integrity protection with other generator polynomials within other contexts, such as communication systems or other storage systems.

Figure 1:
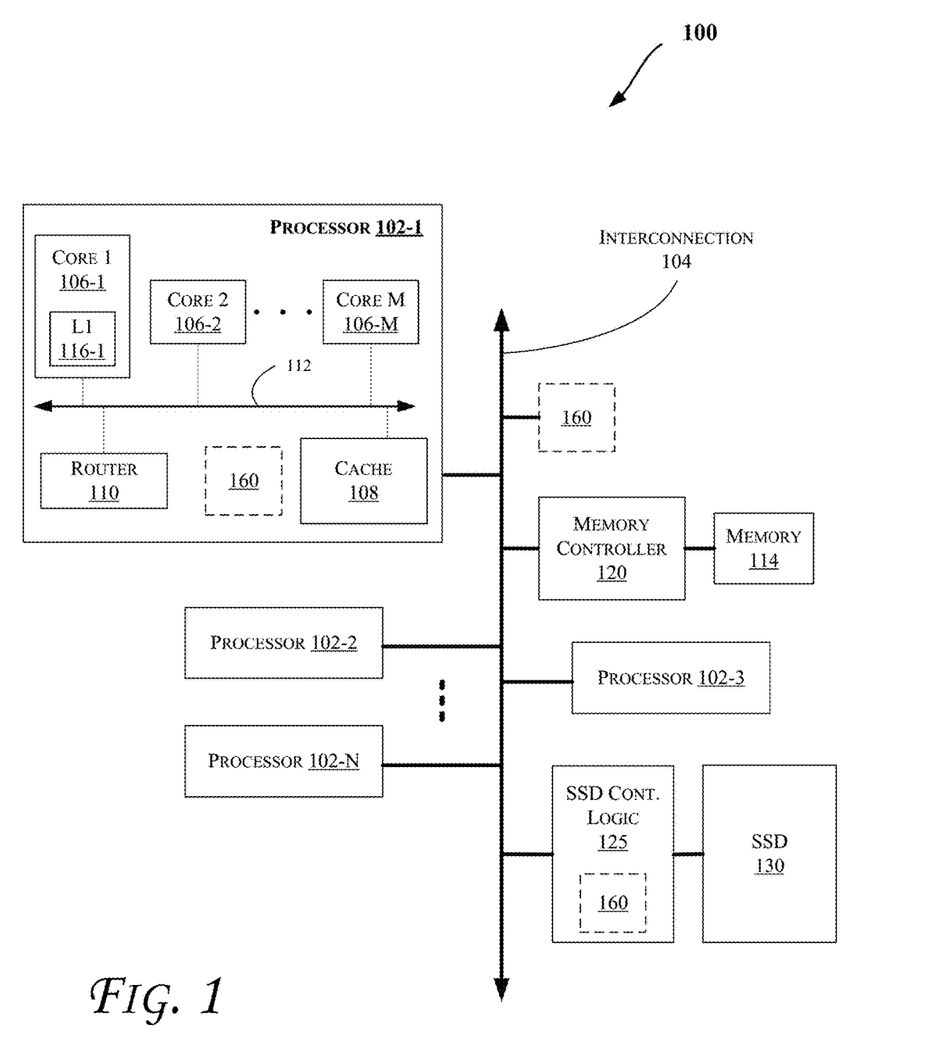
FIGS. 1 and 3-5 illustrate block diagrams of embodiments of computing systems, which may be utilized to implement various embodiments discussed herein.

The techniques discussed herein may be provided in various computing systems (e.g., including a non-mobile computing device such as a desktop, workstation, server, rack system, etc. and a mobile computing device such as a smartphone, tablet, UMPC (Ultra-Mobile Personal Computer), laptop computer, Ultrabook™ computing device, smart watch, smart glasses, smart bracelet, etc.), including those discussed with reference to FIGS. 1-5. More particularly, FIG. 1 illustrates a block diagram of a computing system 100, according to an embodiment. The system 100 may include one or more processors 102-1 through 102-N (generally referred to herein as "processors 102" or "processor 102"). The processors 102 may communicate via an interconnection or bus 104. Each processor may include various components some of which are only discussed with reference to processor 102-1 for clarity. Accordingly, each of the remaining processors 102-2 through 102-N may include the same or similar components discussed with reference to the processor 102-1.

In an embodiment, the processor 102-1 may include one or more processor cores 106-1 through 106-M (referred to herein as "cores 106," or more generally as "core 106"), a processor cache 108 (which may be a shared cache or a private cache in various embodiments), and/or a router 110. The processor cores 106 may be implemented on a single integrated circuit (IC) chip. Moreover, the chip may include one or more shared and/or private caches (such as processor cache 108), buses or interconnections (such as a bus or interconnection 112), logic 120, memory controllers (such as those discussed with reference to FIG. 3-5), or other components.

In one embodiment, the router 110 may be used to communicate between various components of the processor 102-1 and/or system 100. Moreover, the processor 102-1 may include more than one router 110. Furthermore, the multitude of routers 110 may be in communication to enable data routing between various components inside or outside of the processor 102-1.

The processor cache 108 may store data (e.g., including instructions) that are utilized by one or more components of the processor 102-1, such as the cores 106. For example, the processor cache 108 may locally cache data stored in a memory 114 for faster access by the components of the processor 102. As shown in FIG. 1, the memory 114 may be in communication with the processors 102 via the interconnection 104. In an embodiment, the processor cache 108 (that may be shared) may have various levels, for example, the processor cache 108 may be a mid-level cache and/or a last-level cache (LLC). Also, each of the cores 106 may include a level 1 (L1) processor cache (116-1) (generally referred to herein as "L1 processor cache 116"). Various components of the processor 102-1 may communicate with the processor cache 108 directly, through a bus (e.g., the bus 112), and/or a memory controller or hub.

As shown in FIG. 1, memory 114 may be coupled to other components of system 100 through a memory controller 120. Memory 114 includes volatile memory and may be interchangeably referred to as main memory. Even though the memory controller 120 is shown to be coupled between the interconnection 104 and the memory 114, the memory controller 120 may be located elsewhere in system 100. For example, memory controller 120 or portions of it may be provided within one of the processors 102 in some embodiments.

System 100 also includes Non-Volatile (NV) storage (or Non-Volatile Memory (NVM), e.g., NVMe) device such as a Solid State Drive (SSD) 130 coupled to the interconnect 104 via SSD controller logic 125. Hence, logic 125 may control access by various components of system 100 to the SSD 130. Furthermore, even though logic 125 is shown to be directly coupled to the interconnection 104 in FIG. 1, logic 125 may communicate via a storage bus/interconnect (such as the SATA (Serial Advanced Technology Attachment) bus, Peripheral Component Interconnect (PCI) (or PCI express (PCIe) interface), SAS (Serial Attached SCSI), etc.) with one or more other components of system 100 (for example where the storage bus is coupled to interconnect 104 via some other logic like a bus bridge, chipset (such as discussed with reference to FIGS. 2 and 3-5), etc.). Also, a Hard Disk Drive (HDD) may be used instead of or in addition to the SSD (where two or more of the HDDs and/or SSDs may be configured as a RAID (Redundant Array of Independent Disks) system). Additionally, logic 125 may be incorporated into memory controller logic (such as those discussed with reference to FIG. 3-5) or provided on a same Integrated Circuit (IC) device in various embodiments (e.g., on the same IC device as the SSD 130 or in the same enclosure as the SSD 130). System 100 may also include other types of non-volatile storage such as those discussed with reference to FIGS. 3-5, including for example a hard drive, etc.

Figure 3:
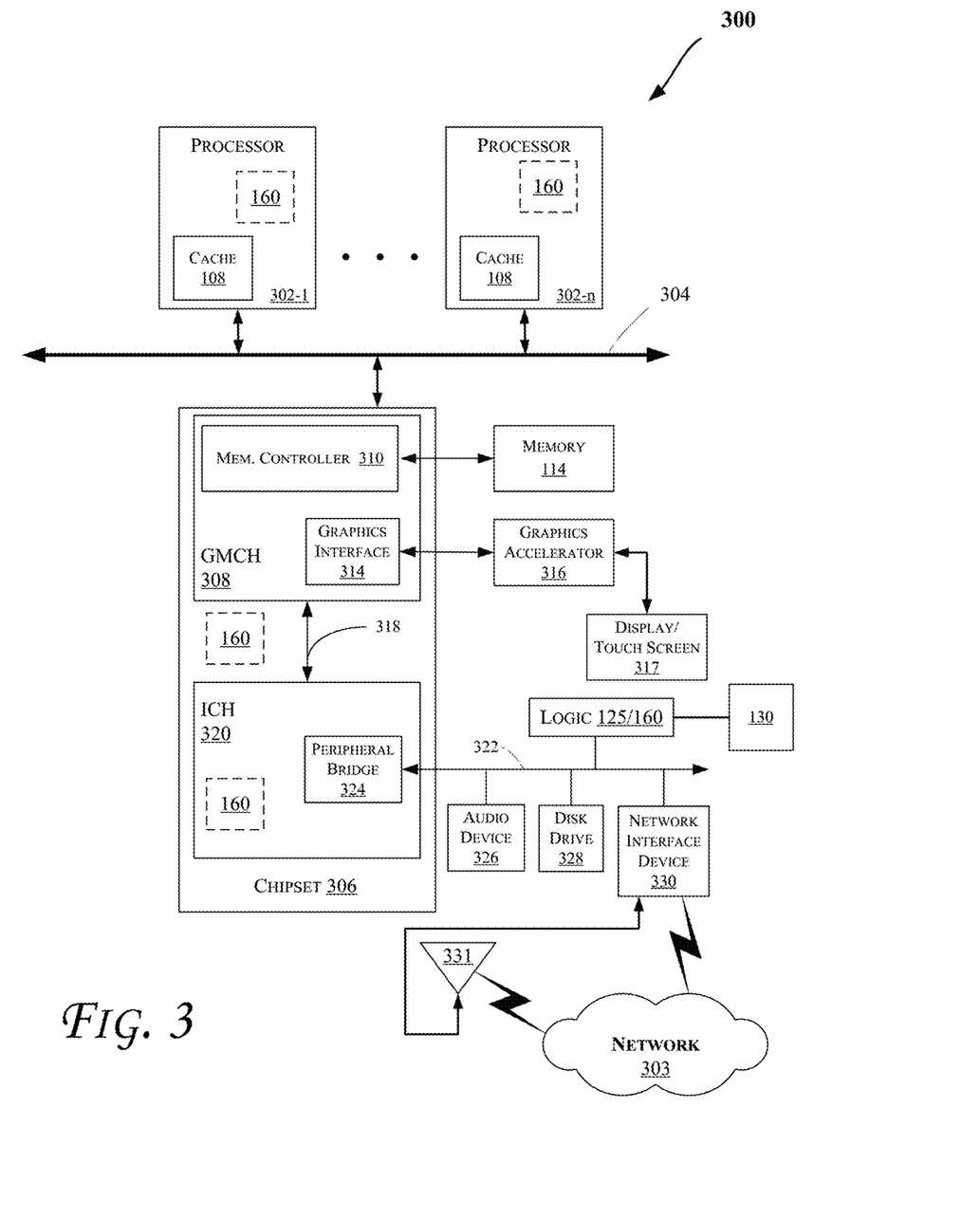
Figure 4:
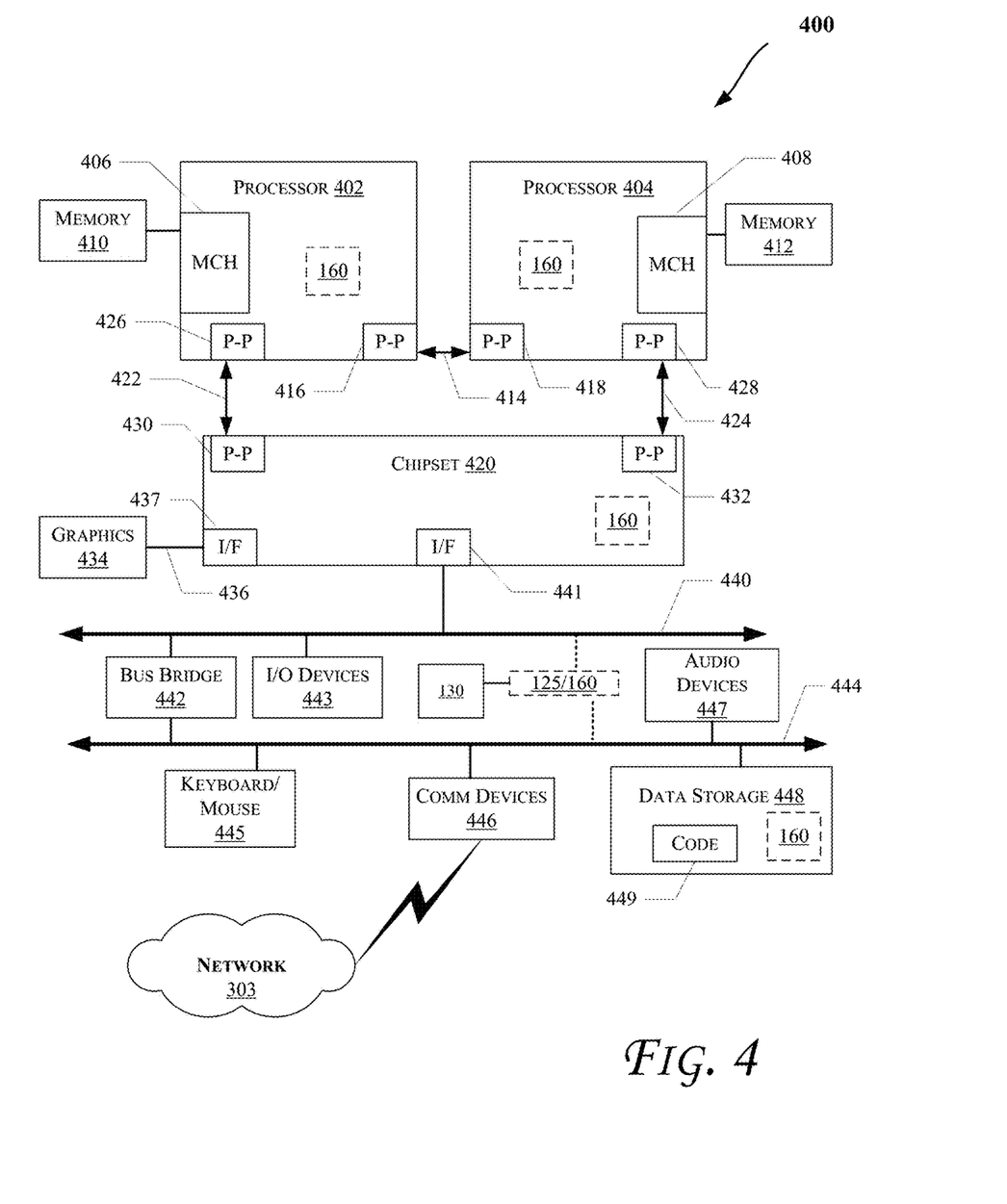
Figure 5:
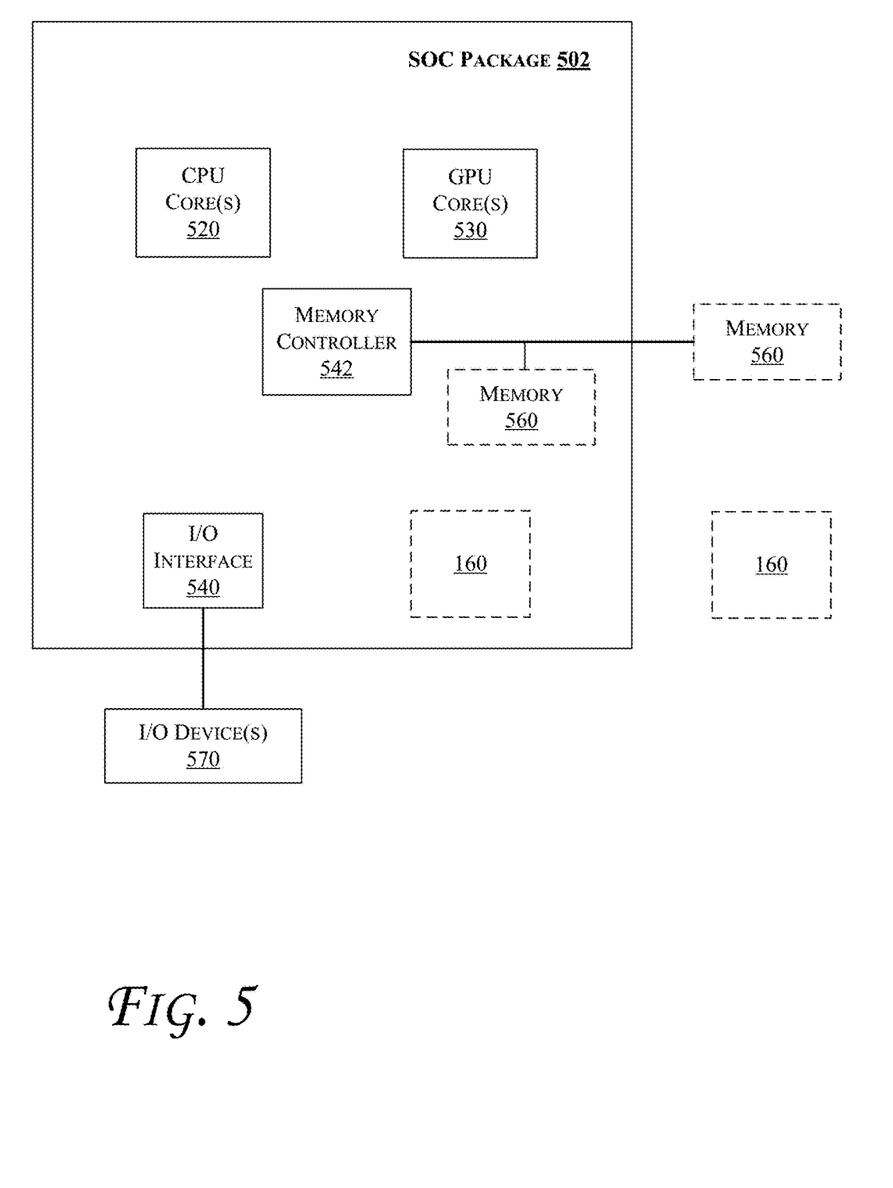

Furthermore, logic 125 and/or SSD 130 may be coupled to one or more sensors (not shown) to receive information (e.g., in the form of one or more bits or signals) to indicate the status of or values detected by the one or more sensors. These sensor(s) may be provided proximate to components of system 100 (or other computing systems discussed herein such as those discussed with reference to other FIGS. including 3-5, for example), including the cores 106, interconnections 104 or 112, components outside of the processor 102, SSD 130, SSD bus, SATA bus, PCIe bus, SAS bus logic 125, etc., to sense variations in various factors affecting power/thermal behavior of the system/platform, such as temperature, operating frequency, operating voltage, power consumption, and/or inter-core communication activity, etc.

Additionally, as shown in FIG. 1, CRC logic 160 may be provided in various locations to provide enhanced CRC computations based on Galois-Field (GF2) arithmetic. Logic 160 may be used to compute CRC values for data communicated/stored in storage devices (e.g., memory 114, SSD 130), network (not shown in FIG. 1 but discussed with reference to FIGS. 3 and/or 4), etc.

Figure 2A:
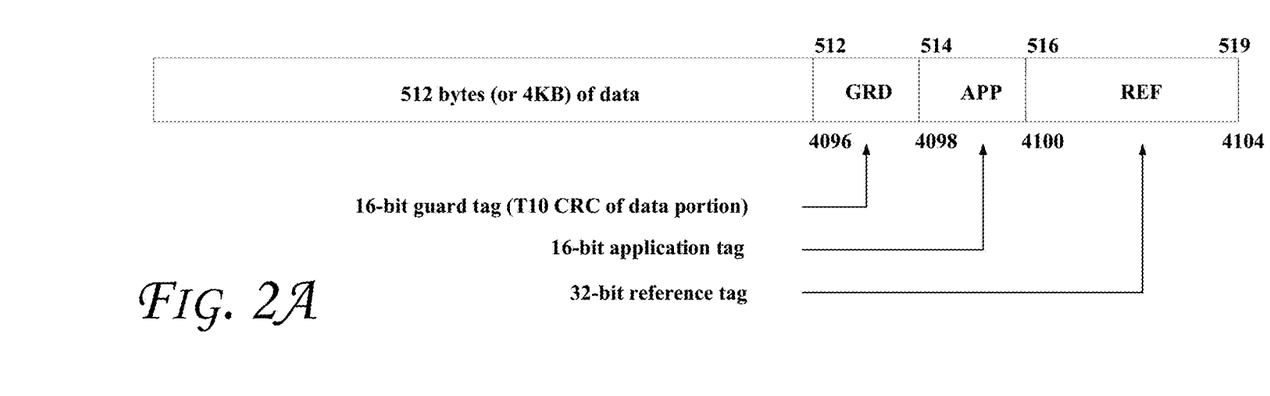
FIG. 2A illustrates various fields of a polynomial which may be utilized in various embodiments.

FIG. 2A illustrates various fields of a INCITS T10 SAS CRC-16 polynomial (0x18 BB7) which may be utilized in various embodiments. These fields may be used (e.g., by logic 160) in a storage system as a guard signature for protecting a logical sector on a storage device/disk. As shown, the fields include data (e.g., 512 bytes (shown on top of the boxes in FIG. 2A) or 4 KB (shown on the bottom of the boxes in FIG. 2A)), a 16-bit guard tag (e.g., for T10 CRC or data portion), a 16-bit application tag (e.g., for user defined values specific to the application), and a 32-bit reference tag (e.g., for logical block qualification such as in hard disk array).

Some solutions may calculate T10 CRC using a Galois Field Arithmetic calculator for a block of data that is limited to integral powers of 2. By contrast, some embodiments provide the ability to handle any arbitrary length data field (which would not be a multiple of the CRC width). For example, in cases where an odd length is used, the CRC logic 160 is extended by analyzing the odd or even part and applying the logic for the fractional single byte. This makes logic 160 universal for any length of data field and can be deployed for any application such as the Transmission Control Protocol (TCP) and the Internet Protocol (IP) (collectively, TCP/IP) networking, where arbitrary lengths of data are common for calculating CRC. For example, Gigabit Ethernet employs data transfers with CRC ranging from small (less than 64 B (Byte)) to jumbo frames (up to 2000 B) in networking with odd values interspersed. Hence, embodiments discussed herein may be used to provide more efficient and flexible solutions for CRC computations.

In one embodiment, a "seed" is added to the CRC calculation logic (e.g., logic 160) that can work for both odd or even sized lengths. The same methodology can be extended to any other CRC polynomial without loss of generality. Also, in various embodiments, full parallel, scalable, and/or more area efficient solution(s) are used to perform CRC computation (e.g., with seed feedback) that provides a significant improvement in gate count savings and/or throughput over other current techniques/implementation.

In terms of mathematical basis, let W be the input data of arbitrary length, M is the CRC width in bits and G(x) is the irreducible polynomial in $GF2^M$, where M=16. The T10 polynomial, G(x) is represented canonically as 0x18 BB7.

Using the polynomial format for W, we can define:

$$W = (w_{nM-1}x^{nM-1} + \ldots + w_{(n-1)M}x^{(n-1)M})x^{(n-1)M} + \ldots +$$
$$(w_{2M-1}x^{2M-1} + \ldots + w_M x^M)x^M + (w_{M-1}x^{M-1} + \ldots + w_0 x^0)$$

$$W \bmod G(x) = \lfloor (w_{nM-1}x^{M-1} + \ldots + w_{(n-1)M}x^0)x^{(n-1)M} + \ldots +$$
$$(w_{2M-1}x^{M-1} + \ldots + w_M x^0)x^M +$$
$$(w_{M-1}x^{M-1} + \ldots + w_M x^0)\rfloor x^M$$
$$= [(w_{nM-1}x^{M-1} + \ldots + w_{(n-1)M}x^0)x^{nM} + \ldots +$$
$$(w_{2M-1}x^{M-1} + \ldots + w_M x^0)x^{2M} +$$
$$(w_{M-1}x^{M-1} + \ldots + w_0 x^0)x^M]\bmod G(x)$$
$$= [W_{n-1} * \beta_{n-1} + \ldots + W_1 * \beta_1 + W_0 * \beta_0]\bmod G(x)$$

where "n" is the number of chunks (bit-slice) and $\beta_i$, i=0, . . . , n−1 are constants given by the recurrence relation defined by $\beta_0 = \beta_0 = G(x)$ $\beta_1 = \beta_0 * \beta_0 = \beta_0^2$ $\beta_2 = \beta_0 * \beta_1 = \beta_0^3$ $\beta_i = \beta_0 * \beta_{i-1} = \beta_0^{i+1}$ $\beta_{n-1} = \beta_0 * \beta_{n-2} = \beta_0^n$ The basic element required for the T10 16-bit CRC is the GF2 multiplier given by $W_i * \beta_i$ for a given bit length. The constants $\beta_i$ can be pre calculated manually (or by logic 160 and/or a software program) and used in a Look-Up Table (LUT) for hardware computation.

Seed Calculation for data length in multiples of CRC polynomial width: To calculate the CRC result for a given data, whose length is a multiple of the CRC width (16-bits in the case of T10) with an initial non-zero seed, we first consider that the data W is preceded by a message T such that T % G(x)=S, where S is the seed and "%" refers to modulo. Under this assumption, we have the following equations:

$$(T + W) \bmod G(x) = [T + W_{n-1} * \beta_{n-1} + \ldots + W_1 * \beta_1 + W_0 * \beta_0]\bmod G(x)$$
$$= [(T_{n-1} * \beta_{n-2} + \ldots + T_1 * \beta_0 + T_0)\beta_n + W_{n-1} *$$
$$\beta_{n-1} + \ldots + W_1 * \beta_1 + W_0 * \beta_0]\bmod G(x)$$
$$= [(T_{n-1} * \beta_{n-1} + \ldots + T_1 * \beta_1 + T_0 * \beta_0) * \beta_{n-1} + W_{n-1} *$$
$$\beta_{n-1} + \ldots + W_1 * \beta_1 + W_0 * \beta_0]\bmod G(x)$$
$$= [S * \beta_{n-1} + W_{n-1} * \beta_{n-1} + \ldots + W_1 * \beta_1 + W_0 * \beta_0]$$
$$\bmod G(x)$$
$$= [(S + W_{n-1}) * \beta_{n-1} + \ldots + W_1 * \beta_1 + W_0 * \beta_0]\bmod G(x)$$

This shows that logically XOR-ing (or exclusive OR-ing) the seed S with the most significant word of the data prior to sending to the GF2 multiplier logic (with $\beta_{n-1}$ as the other operand) provides the result where the data size is a multiple of the polynomial G(x).

One issue with the above seed calculation is that the method assumes that the data length is a multiple of the CRC width. It does not account for the situations where the data may potentially be odd sized. However, any application intending to use the SAS T10 polynomial with odd length can benefit from such techniques. To this end, a scheme where the CRC for any sized data can be calculated will be discussed next. For example, let us consider the case, where the T10 CRC needs to be computed for a single byte of data.

Figure 2B:
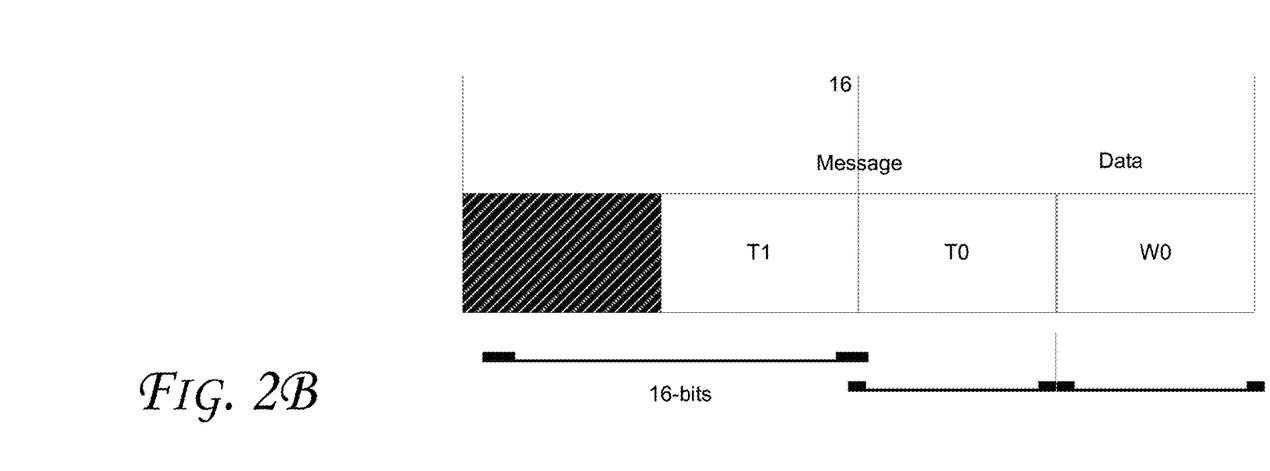
FIG. 2B illustrates a block diagram of data and seed layout for CRC computations, according to an embodiment.

Single Byte T10 CRC Calculation: For calculating the T10 CRC for a data of length 1 B with a given seed, let us assume there is an input message, T, as shown in FIG. 2B (illustrating a block diagram of data and seed layout for CRC computations, according to an embodiment), which is 16-bits in length such that $T=T_1 * x^8 + T_0$. Calculating T % G(x), we get:

$T \bmod G(x) = (T_1 * x^8 + T_0) \% G(x) = S$, where S is the seed obtained from the operation. Now, we can represent the seed S as:

$S = S_1 * x^8 + S_0$, where $S_1$ is the MSB (Most Significant Bit) while $S_0$ is the LSB (Least Significant Bit).

If the single byte data of interest, $W=W_0$ is preceded by T as shown in the FIG. 2B, we can calculate the modulo operation as below:

$$(T + W) \bmod G(x) = [(T_1 * x^{16} + T_0 x^8 + W_0) * \beta_0]\bmod G(x)$$
$$= [T_1 * \beta_0 * x^{16} + T_0 x^8 * \beta_0 + W_0 * \beta_0]\bmod G(x)$$
$$= [(T_1 * \beta_0 * x^8 + T_0 * \beta_0)x^8 + W_0 * \beta_0]\bmod G(x)$$
$$= [S * x^8 + W_0 * \beta_0]\bmod G(x) \ldots //$$
$$\text{Multiply\_Seed\_by\_256}$$
$$= [(S_1 * x^8 + S_0)x^8 + W_0 * \beta_0]\bmod G(x)$$
$$= [S_1 * x^{16} + S_0 x^8 + W_0 * \beta_0]\bmod G(x)$$
$$= [S_1 * \beta_0 + S_0 x^8 + W_0 * \beta_0]\bmod G(x)$$
$$= [(S_1 \wedge W_0) * \beta_0 + S_0 * x^8]\bmod G(x)$$

Figure 2C:
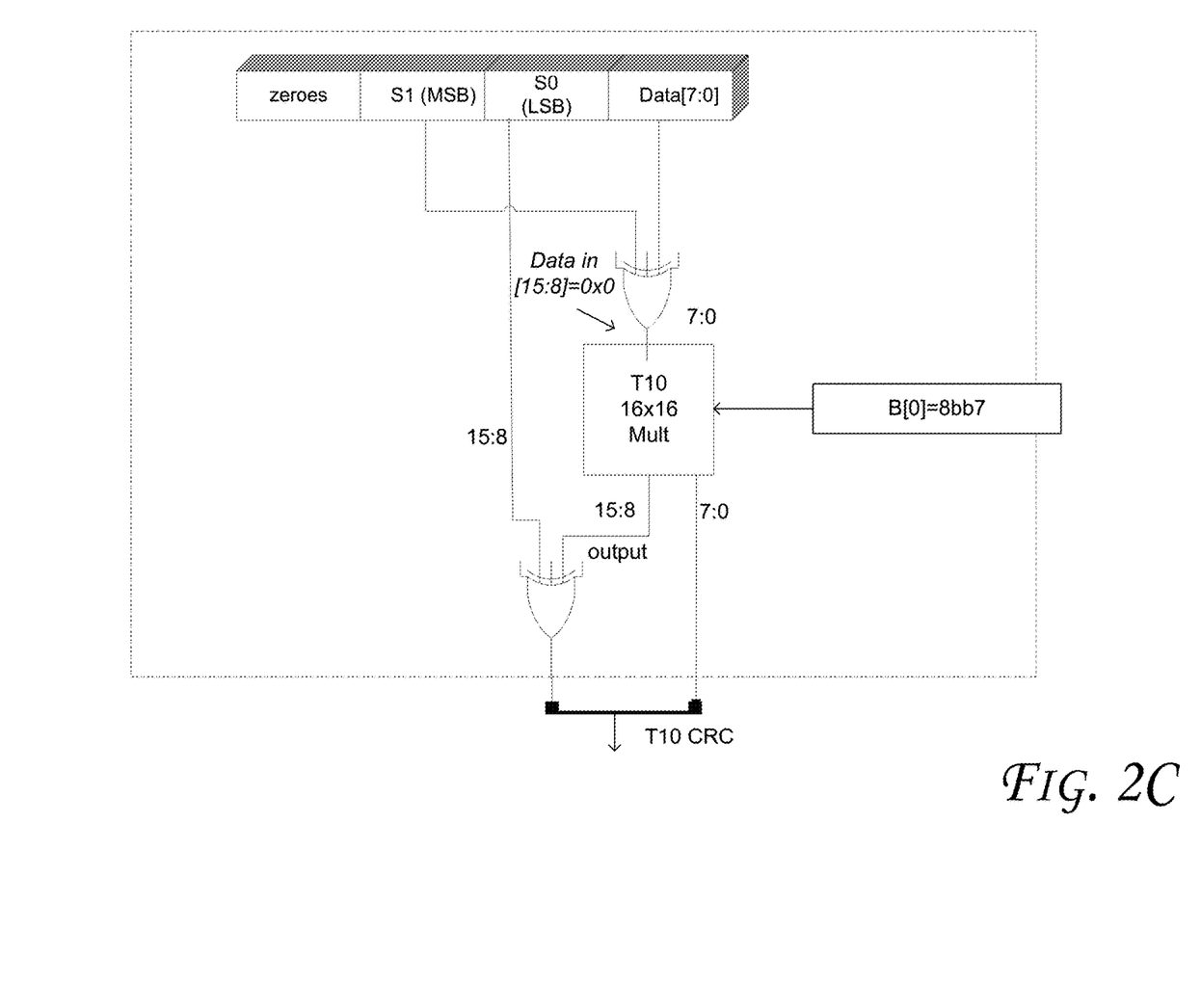
FIG. 2C illustrates a block diagram of a multiplier logic, according to an embodiment.

In effect, the multiply operation by "256" that occurs in the middle of the equation above reduces to a shift and XOR operation with the data $W_0$; thus, simplifying the logic requirement as shown in FIG. 2C.

More particularly, FIG. 2C illustrates a block diagram of a single byte GF2 based T10 polynomial multiplier logic, according to an embodiment. The logic 160 may include the components of FIG. 2C in one embodiment. Furthermore, a generalized T10 CRC calculator may be constructed that analyzes the data length and splits the data stream into an even portion and an odd portion. For example, if we have a case where the data length is 7 B), we can construct the T10 CRC logic for the first 6 B (even) and use the result as a seed for the last byte (odd) of the "Single Byte T10 CRC logic" as shown in FIG. 2C.

Figure 2D:
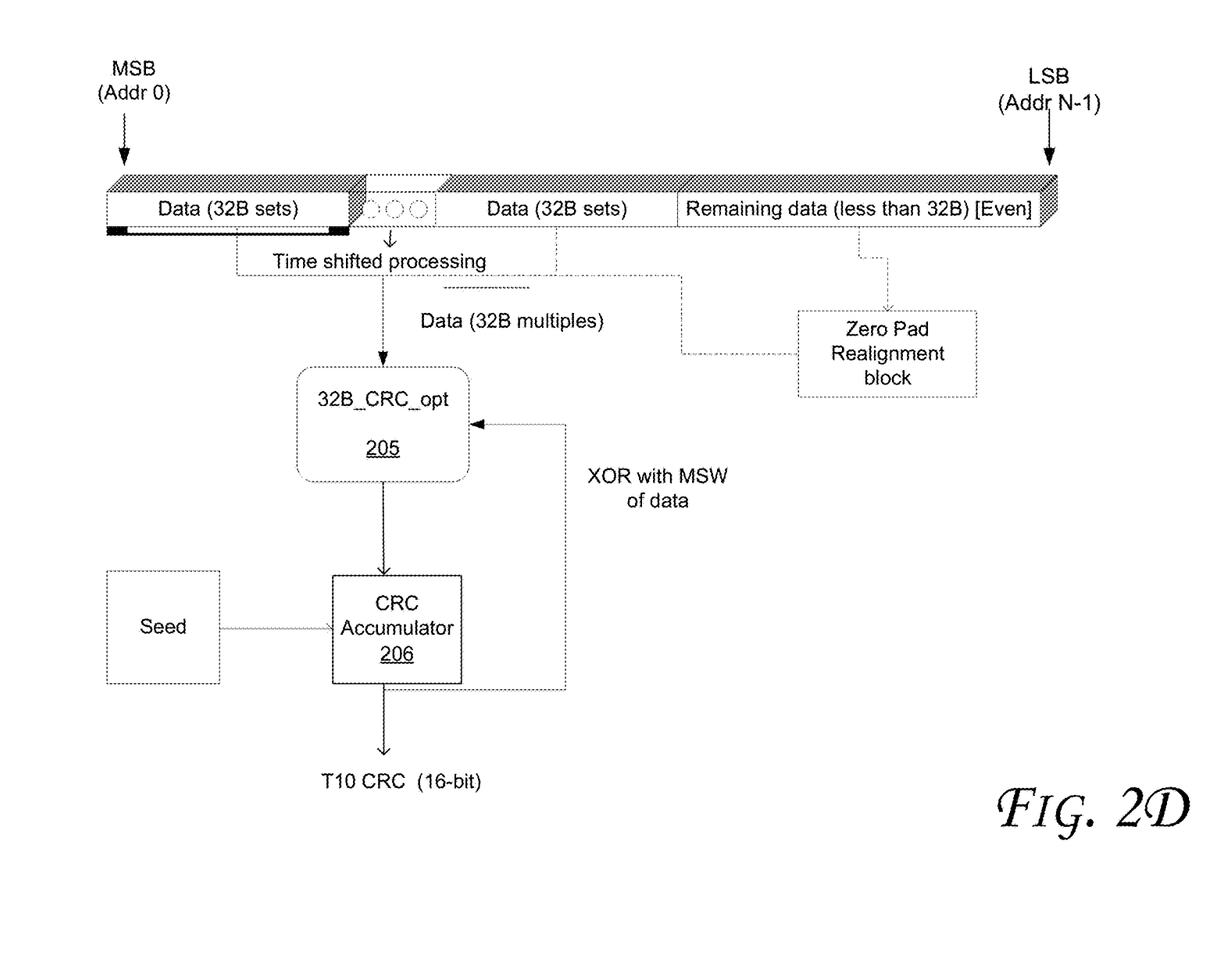
FIG. 2D illustrates a block diagram of a T10 CRC calculation using a multiplier logic for even length data, according to an embodiment.

FIG. 2D illustrates a block diagram of a T10 CRC calculation using a 32 Byte (B) GF2 multiplier logic for even length data, according to an embodiment. The logic 160 may include the components of FIG. 2D in one embodiment. As shown in FIG. 2D, 32 B sets of data are fed to 32 B CRC optimized (where "optimized" is labeled as "opt" in the figures for simplicity) calculation logic 205, which multiplies the data sets and then XORs the result with the MSW (Most Significant Word) of the data from logic 206 (wherein the MSW may be two bytes). The output of the logic 205 is then accumulated by logic 206 (e.g., based on the seed value from a previous stage, e.g., as discussed above and as shown in FIG. 2D) to provide a resulting T10 CRC value (e.g., in 16 bits) for even length data. The time shifting concept in FIG. 2D signifies the fact that the same CRC logic is used repeatedly to calculate the result based on the prior computed value (seed) and the remaining sets of data for a given transfer length. Further, the remaining data (i.e., less than 32 B), can be zero padded to achieve block realignment as shown in FIG. 2D. As an example, if the CRC needs to be calculated for 64 B of data, it is broken into two sets of 32 B and the same logic is used in two cycles to accumulate the result.

Figure 2E:
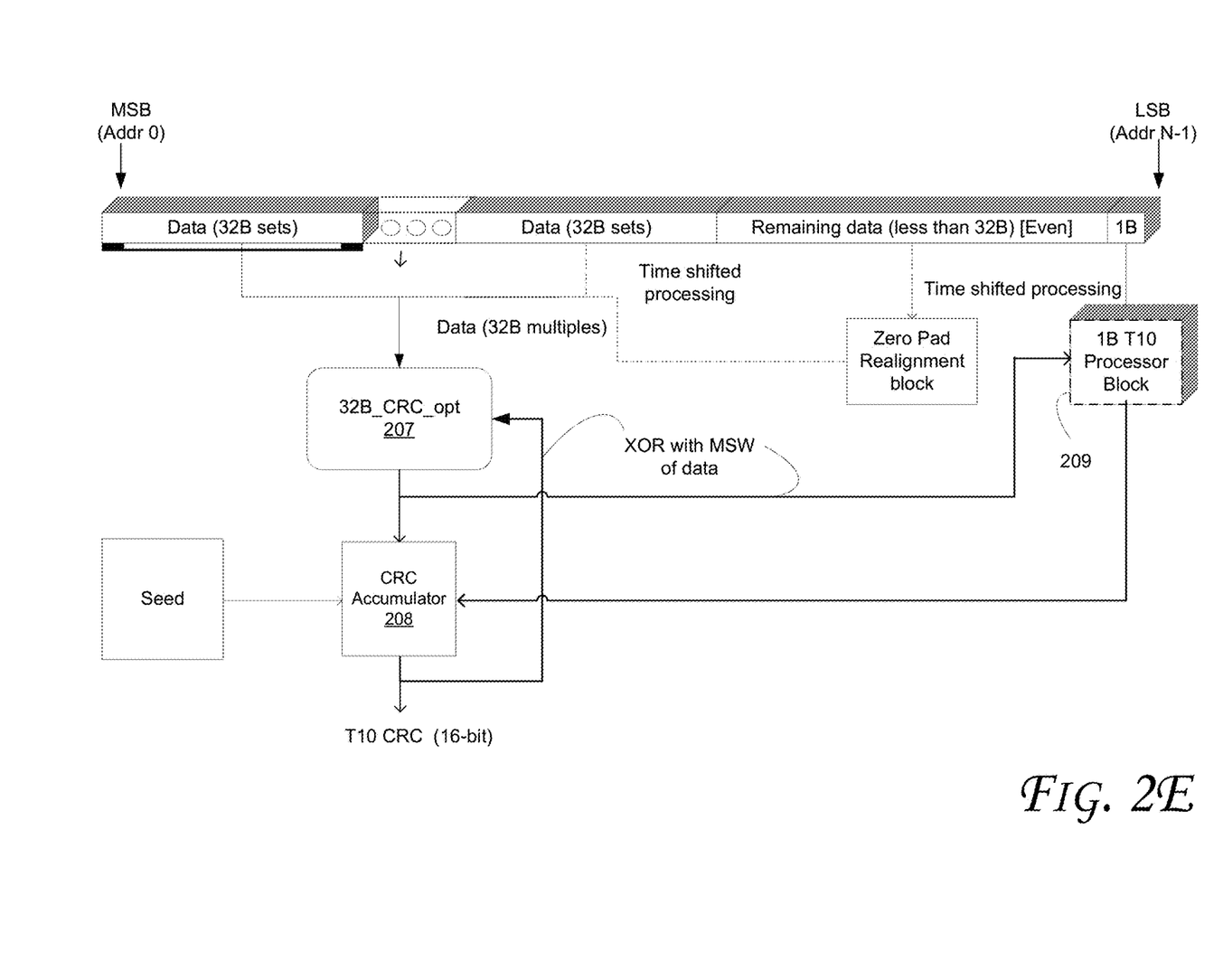
FIG. 2E illustrates a block diagram of a T10 CRC calculation using a multiplier logic for odd length data, according to an embodiment.

FIG. 2E illustrates a block diagram of a T10 CRC calculation using a 32 B GF2 multiplier logic for odd length data, according to an embodiment. The logic 160 may include the components of FIG. 2E in one embodiment. As shown in FIG. 2E, 32 B sets of data are fed to 32 B CRC calculation logic 207, which multiplies the data sets and then XORs the result with the MSW of the data from logic 208. The output of the logic 207 is then accumulated by logic 208 (e.g., based on the seed value from a previous stage, e.g., as discussed above and as shown in FIG. 2E) to provide a resulting T10 CRC value (e.g., in 16 bits) for odd length data. Further, the remaining data (i.e., less than 32 B), can be zero padded to achieve block realignment as shown in FIG. 2E, with the last byte (1 B) being fed to the 1 B T10 processor logic block 209, together with the MSW of data from logic 208 to be XORed with the 1 B. Logic block 209 is processes the CRC for a single byte of data that is left over at the end of data stream. As an example, CRC for a 33 byte data is broken into two sets of 32 B and 1 B to make up the data stream. As shown in FIG. 2E, the output from logic block 209 is fed to the logic 208 to be accumulated with output of logic 207 to generate the T10 CRC values.

Accordingly, some implementations may use a circuit for calculating the T10 CRC for a large block of data (e.g., 512 B or 4096 B) using Horner's rule to manage the overhead hardware complexity. These implementations may use a step and repeat scheme with an extra stage of multiplier to output the result. By contrast, some embodiments optimize the T10 CRC logic by using the CRC result from the previous stage as input seed to the next stage (e.g., as shown and discussed with reference to FIGS. 2D and 2E). Through this scheme, the extra multiplier that was previously used can be eliminated and also the silicon area use may be reduced, e.g., as shown in FIG. 2F.

Figure 2F:
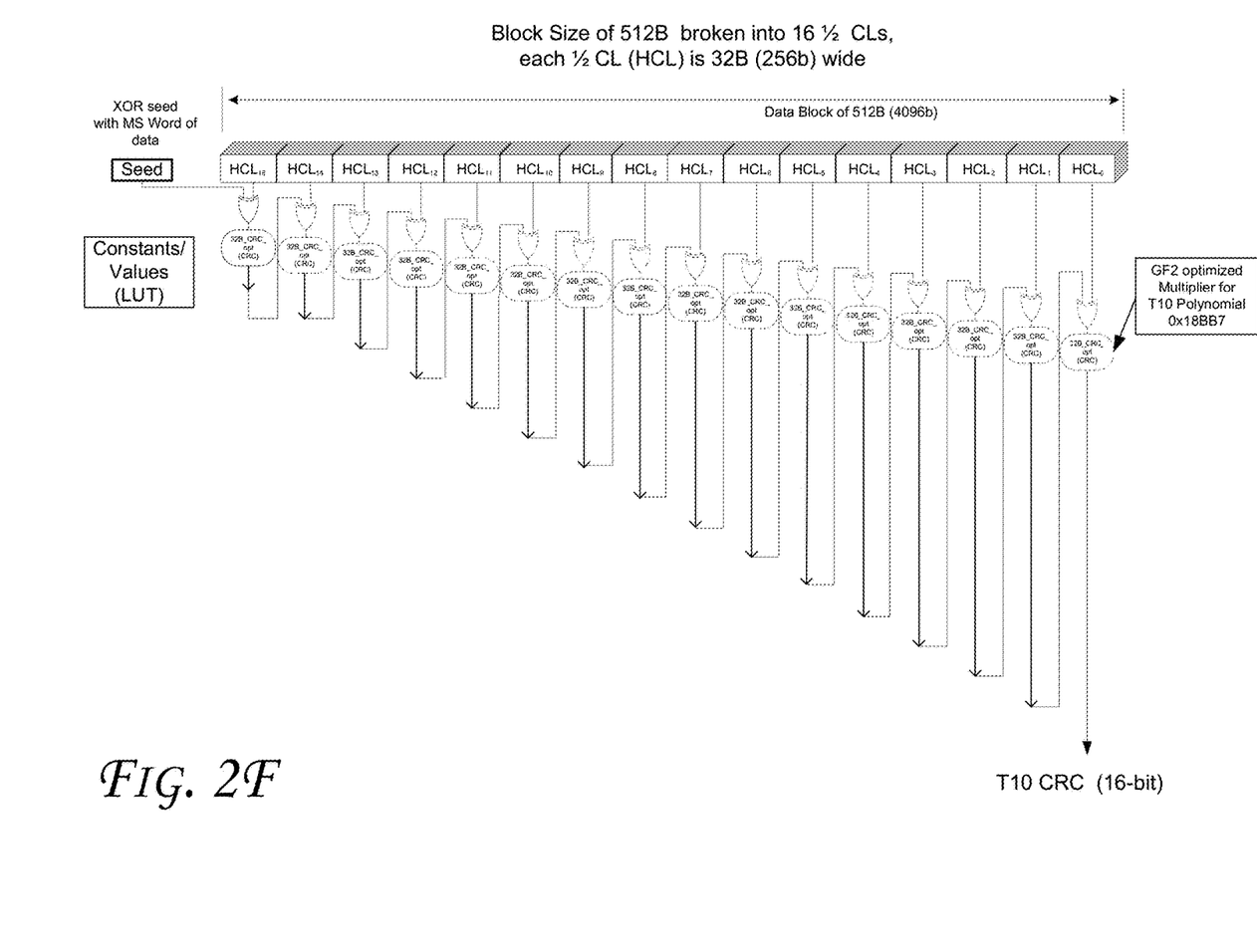
FIG. 2F illustrates a block diagram of an optimized T10 CRC calculation using seed feedback, according to an embodiment.

More particularly, FIG. 2F illustrates a block diagram of an optimized T10 CRC calculation using seed feedback, according to an embodiment. The logic 160 may include the components of FIG. 2F in one embodiment. As illustrated, the block size of 512 B (although other block sizes may be used in various embodiments such as 4096 B (e.g., with more time-shifted stages but still the methodology uses the same or similar circuit with step and repeat), etc.) is broken into sixteen ½ Cache Lines (CLs), wherein each Half CL (HCL) is 32 B (or 256 b (bit)) wide. These HCLs (labeled as $HCL_{15}$ to $HCL_0$ in FIG. 2F) are XORed (by the illustrated XOR logic gates in FIG. 2F) with the output of the previous CRC logic (labeled as 32 B_CRC_opt in FIG. 2F). The CRC logic of FIG. 2F may be the same or similar to logic (e.g., logic 205 and/or 207) discussed with reference to FIGS. 2D and 2E. At the first stage, the XOR logic XORs $HCL_{15}$ and the XOR seed with MSW of data, e.g., as discussed with reference to FIG. 2D and/or 2E. In turn, the output of the last stage (under $HCL_0$) provides the T10 CRC value (in 16 bits). The CRC_32 B_opt is a multiplier that uses Beta Look up Table (LUT) constants/values (such as shown in the Table 1 below), as well as the incoming data for CRC multiplication/reduction.

TABLE 1

| Sample Coefficients for GF2 Multiplication for T10 | |
|---|---|
| Beta | Value |
| Beta[0] | 8bb7 |
| Beta[1] | 7E66 |
| Beta[2] | 1368 |
| Beta[3] | f249 |
| Beta[4] | 2d56 |
| Beta[5] | 5890 |
| Beta[6] | fb0b |
| Beta[7] | a010 |
| Beta[8] | 06df |
| Beta[9] | 48d2 |
| Beta[10] | 4c1a |
| Beta[11] | 1faa |
| Beta[12] | 6ee3 |
| Beta[13] | e320 |
| Beta[14] | be6c |
| Beta[15] | 857d |

For Table 1, it is assumed ½ CL (or 32 B) is used as the basic entity in DMA Datapath to feed into the GF2 multiplier array. Moreover, 32 B of data would use 16 sets of GF2 16×16 multipliers for calculating the T10 CRC value.

Figure 2G:
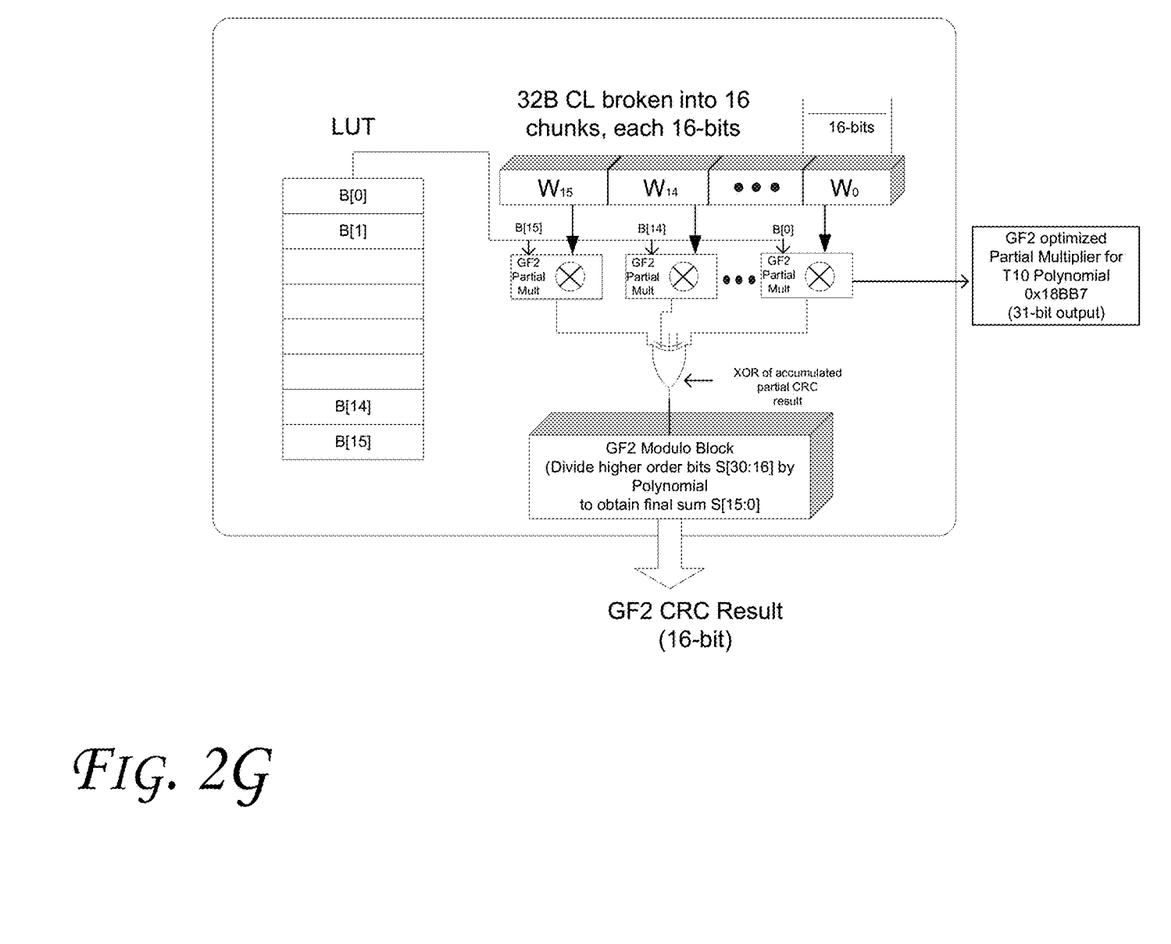
FIG. 2G illustrates a block diagram of an optimized T10 CRC calculation logic, according to an embodiment.

FIG. 2G illustrates a block diagram of an optimized T10 CRC calculation logic, according to an embodiment. The logic 160 may include the components of FIG. 2G in one embodiment. As shown in FIG. 2G, LUT values (such as discussed with reference to the sample values of Table 1 above) are used to calculate partial multiplication values for (e.g., 16-bit) chunks of a divided 32 B CL (e.g., using an XOR operation and a modulo block as shown) to generate a (e.g., 16-bit) GF2 CRC result as well as an (e.g., 31-bit) output for a GF2 optimized partial multiplier for T10 polynomial 0x18 BB7. Furthermore, while some embodiments may utilize an initial seed value of 0, the initial seed value can be any arbitrary value, as the initial seed value is important for the final CRC result.

FIG. 3 illustrates a block diagram of a computing system 300 in accordance with an embodiment. The computing system 300 may include one or more central processing unit(s) (CPUs) 302 or processors that communicate via an interconnection network (or bus) 304. The processors 302 may include a general purpose processor, a network processor (that processes data communicated over a computer network 303), an application processor (such as those used in cell phones, smart phones, etc.), or other types of a processor (including a reduced instruction set computer (RISC) processor or a complex instruction set computer (CISC)). Various types of computer networks 303 may be utilized including wired (e.g., Ethernet, Gigabit, Fiber, etc.) or wireless networks (such as cellular, including 3G (Third-Generation Cell-Phone Technology or 3rd Generation Wireless Format (UWCC)), 4G (Fourth-Generation Cell-Phone Technology), 4G Advanced, Low Power Embedded (LPE), etc.). Moreover, the processors 302 may have a single or multiple core design. The processors 302 with a multiple core design may integrate different types of processor cores on the same integrated circuit (IC) die. Also, the processors 302 with a multiple core design may be implemented as symmetrical or asymmetrical multiprocessors.

In an embodiment, one or more of the processors 302 may be the same or similar to the processors 102 of FIG. 1. For example, one or more of the processors 302 may include one or more of the cores 106 and/or processor cache 108. Also, the operations discussed with reference to FIGS. 1-2G may be performed by one or more components of the system 300.

A chipset 306 may also communicate with the interconnection network 304. The chipset 306 may include a graphics and memory control hub (GMCH) 308. The GMCH 308 may include a memory controller 310 (which may be the same or similar to the memory controller 120 of FIG. 1 in an embodiment) that communicates with the memory 114. The memory 114 may store data, including sequences of instructions that are executed by the CPU 302, or any other device included in the computing system 300. Also, system 300 includes logic 125, logic 160, and/or SSD 130 in various locations such as shown or not shown. In one embodiment, the memory 114 may include one or more volatile storage (or memory) devices such as random access memory (RAM), dynamic RAM (DRAM), synchronous DRAM (SDRAM), static RAM (SRAM), or other types of storage devices. Nonvolatile memory may also be utilized such as a hard disk drive, flash, etc., including any NVM discussed herein. Additional devices may communicate via the interconnection network 304, such as multiple CPUs and/or multiple system memories.

The GMCH 308 may also include a graphics interface 314 that communicates with a graphics accelerator 316. In one embodiment, the graphics interface 314 may communicate with the graphics accelerator 316 via an accelerated graphics port (AGP) or Peripheral Component Interconnect (PCI) (or PCI express (PCIe) interface). In an embodiment, a display 317 (such as a flat panel display, touch screen, etc.) may communicate with the graphics interface 314 through, for example, a signal converter that translates a digital representation of an image stored in a storage device such as video memory or system memory into display signals that are interpreted and displayed by the display. The display signals produced by the display device may pass through various control devices before being interpreted by and subsequently displayed on the display 317.

A hub interface 318 may allow the GMCH 308 and an input/output control hub (ICH) 320 to communicate. The ICH 320 may provide an interface to I/O devices that communicate with the computing system 300. The ICH 320 may communicate with a bus 322 through a peripheral bridge (or controller) 324, such as a peripheral component interconnect (PCI) bridge, a universal serial bus (USB) controller, or other types of peripheral bridges or controllers. The bridge 324 may provide a data path between the CPU 302 and peripheral devices. Other types of topologies may be utilized. Also, multiple buses may communicate with the ICH 320, e.g., through multiple bridges or controllers. Moreover, other peripherals in communication with the ICH 320 may include, in various embodiments, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or other devices.

The bus 322 may communicate with an audio device 326, one or more disk drive(s) 328, and a network interface device 330 (which is in communication with the computer network 303, e.g., via a wired or wireless interface). As shown, the network interface device 330 may be coupled to an antenna 331 to wirelessly (e.g., via an Institute of Electrical and Electronics Engineers (IEEE) 802.11 interface (including IEEE 802.11a/b/g/n/ac, etc.), cellular interface, 3G, 4G, LPE, etc.) communicate with the network 303. Other devices may communicate via the bus 322. Also, various components (such as the network interface device 330) may communicate with the GMCH 308 in some embodiments. In addition, the processor 302 and the GMCH 308 may be combined to form a single chip. Furthermore, the graphics accelerator 316 may be included within the GMCH 308 in other embodiments.

Furthermore, the computing system 300 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 328), a floppy disk, a compact disk ROM (CD-ROM), a digital versatile disk (DVD), flash memory, a magneto-optical disk, or other types of nonvolatile machine-readable media that are capable of storing electronic data (e.g., including instructions).

FIG. 4 illustrates a computing system 400 that is arranged in a point-to-point (PtP) configuration, according to an embodiment. In particular, FIG. 4 shows a system where processors, memory, and input/output devices are interconnected by a number of point-to-point interfaces. The operations discussed with reference to FIGS. 1-4 may be performed by one or more components of the system 400.

As illustrated in FIG. 4, the system 400 may include several processors, of which only two, processors 402 and 404 are shown for clarity. The processors 402 and 404 may each include a local memory controller hub (MCH) 406 and 408 to enable communication with memories 410 and 412. The memories 410 and/or 412 may store various data such as those discussed with reference to the memory 114 of FIGS. 1 and/or 3. Also, MCH 406 and 408 may include the memory controller 120 in some embodiments. Furthermore, system 400 includes logic 125, logic 160, and/or SSD 130 in various locations such as shown or not shown. These logic 125/160 and/or SSD 130 may be coupled to system 400 via bus 440/544, via other point-to-point connections to the processor(s) 402/504 or chipset 420, etc. in various embodiments.

In an embodiment, the processors 402 and 404 may be one of the processors 302 discussed with reference to FIG. 3. The processors 402 and 404 may exchange data via a point-to-point (PtP) interface 414 using PtP interface circuits 416 and 418, respectively. Also, the processors 402 and 404 may each exchange data with a chipset 420 via individual PtP interfaces 422 and 424 using point-to-point interface circuits 426, 428, 430, and 432. The chipset 420 may further exchange data with a high-performance graphics circuit 434 via a high-performance graphics interface 436, e.g., using a PtP interface circuit 437. As discussed with reference to FIG. 3, the graphics interface 436 may be coupled to a display device (e.g., display 317) in some embodiments.

In one embodiment, one or more of the cores 106 and/or processor cache 108 of FIG. 1 may be located within the processors 402 and 404 (not shown). Other embodiments, however, may exist in other circuits, logic units, or devices within the system 400 of FIG. 4. Furthermore, other embodiments may be distributed throughout several circuits, logic units, or devices illustrated in FIG. 4.

The chipset 420 may communicate with a bus 440 using a PtP interface circuit 441. The bus 440 may have one or more devices that communicate with it, such as a bus bridge 442 and I/O devices 443. Via a bus 444, the bus bridge 442 may communicate with other devices such as a keyboard/mouse 445, communication devices 446 (such as modems, network interface devices, or other communication devices that may communicate with the computer network 303, as discussed with reference to network interface device 330 for example, including via antenna 331), audio I/O device, and/or a data storage device 448. The data storage device 448 may store code 449 that may be executed by the processors 402 and/or 404.

In some embodiments, one or more of the components discussed herein can be embodied as a System On Chip (SOC) device. FIG. 5 illustrates a block diagram of an SOC package in accordance with an embodiment. As illustrated in FIG. 5, SOC 502 includes one or more Central Processing Unit (CPU) cores 520, one or more Graphics Processor Unit (GPU) cores 530, an Input/Output (I/O) interface 540, and a memory controller 542. Various components of the SOC package 502 may be coupled to an interconnect or bus such as discussed herein with reference to the other figures. Also, the SOC package 502 may include more or less components, such as those discussed herein with reference to the other figures. Further, each component of the SOC package 520 may include one or more other components, e.g., as discussed with reference to the other figures herein. In one embodiment, SOC package 502 (and its components) is provided on one or more Integrated Circuit (IC) die, e.g., which are packaged onto a single semiconductor device.

As illustrated in FIG. 5, SOC package 502 is coupled to a memory 560 (which may be similar to or the same as memory discussed herein with reference to the other figures) via the memory controller 542. In an embodiment, the memory 560 (or a portion of it) can be integrated on the SOC package 502.

The I/O interface 540 may be coupled to one or more I/O devices 570, e.g., via an interconnect and/or bus such as discussed herein with reference to other figures. I/O device(s) 570 may include one or more of a keyboard, a mouse, a touchpad, a display, an image/video capture device (such as a camera or camcorder/video recorder), a touch screen, a speaker, or the like. Furthermore, SOC package 502 may include/integrate items 114/120/160 in an embodiment. Alternatively, items 114/120/160 may be provided outside of the SOC package 502 (i.e., as a discrete logic).

The following examples pertain to further embodiments. Example 1 includes an apparatus comprising: a plurality of exclusive OR logic comprising first exclusive OR logic and second exclusive OR logic; first Galois Field multiplier logic to multiply a first output from the first exclusive OR logic and a first portion of a plurality of portions of input data; and second Galois Field multiplier logic to multiply a second output from the second exclusive OR logic and a second portion of the plurality of portions of the input data. Example 2 includes the apparatus of example 1, wherein the second portion of the input data is to follow the first portion of the input data. Example 3 includes the apparatus of example 1, wherein the first exclusive OR logic is to generate the first output based at least in part on an exclusive OR operation to be performed on the first portion of the plurality of portions of the input data and a third output from a third exclusive OR logic. Example 4 includes the apparatus of example 3, wherein the third exclusive OR logic is to generate the third output based at least in part on an exclusive OR operation to be performed on a third portion of the input data, wherein the second portion of the input data is to follow the third portion of the input data. Example 5 includes the apparatus of example 1, wherein an initial one of the plurality of exclusive OR logic is to generate its output based at least in part on an initial portion of the input data and an initial seed. Example 6 includes the apparatus of example 1, wherein a last one of the plurality of exclusive OR logic is to generate a cyclical redundancy check value. Example 7 includes the apparatus of example 1, wherein the input data is to comprise 512 bytes of data or 4096 bytes of data, wherein each of a plurality of portions of the input data is to comprise 32 bytes. Example 8 includes the apparatus of example 7, wherein at least one portion of the input data is to comprise 1 byte or less than 32 bytes. Example 9 includes the apparatus of example 1, wherein at least one network interface is to communicate at least a portion of the input data. Example 10 includes the apparatus of example 9, comprising logic to calculate a cyclical redundancy check value for the 1 byte of the input data. Example 11 includes the apparatus of example 1, wherein a processor, having one or more processor cores, is to comprise one or more of: the plurality of exclusive OR logic, first Galois Field multiplier logic, and the second Galois Field multiplier logic.

Example 12 includes a method comprising: multiplying, at first Galois Field multiplier logic, a first output from a first exclusive OR logic of a plurality of exclusive OR logic and a first portion of a plurality of portions of input data; and multiplying, at second Galois Field multiplier logic, a second output from a second exclusive OR logic of the plurality of exclusive OR logic and a second portion of the plurality of portions of the input data. Example 13 includes the method of example 12, wherein the second portion of the input data is to follow the first portion of the input data. Example 14 includes the method of example 12, further compromising the first exclusive OR logic generating the first output based at least in part on an exclusive OR operation performed on the first portion of the plurality of portions of the input data and a third output from a third exclusive OR logic. Example 15 includes the method of example 12, further comprising an initial one of the plurality of exclusive OR logic generating its output based at least in part on an initial portion of the input data and an initial seed. Example 16 includes the method of example 12, further comprising a last one of the plurality of exclusive OR logic generating a cyclical redundancy check value. Example 17 includes the method of example 12, wherein the input data comprises 512 bytes of data or 4096 bytes of data, wherein each of a plurality of portions of the input data comprises 32 bytes. Example 18 includes the method of example 17, wherein at least one portion of the input data comprises less than 32 bytes. Example 19 includes the method of example 18, further comprising calculating a cyclical redundancy check value for the 1 byte of the input data.

Example 20 includes a computer-readable medium comprising one or more instructions that when executed on at least one processor configure the at least one processor to perform one or more operations to: multiply, at first Galois Field multiplier logic, a first output from a first exclusive OR logic of a plurality of exclusive OR logic and a first portion of a plurality of portions of input data; and multiply, at second Galois Field multiplier logic, a second output from a second exclusive OR logic of the plurality of exclusive OR logic and a second portion of the plurality of portions of the input data. Example 21 includes the computer-readable medium of example 20, wherein the second portion of the input data is to follow the first portion of the input data. Example 22 includes the computer-readable medium of example 20, further comprising one or more instructions that when executed on the at least one processor configure the at least one processor to perform one or more operations to cause the first exclusive OR logic to generate the first output based at least in part on an exclusive OR operation performed on the first portion of the plurality of portions of the input data and a third output from a third exclusive OR logic. Example 23 includes the computer-readable medium of example 20, further comprising one or more instructions that when executed on the at least one processor configure the at least one processor to perform one or more operations to cause an initial one of the plurality of exclusive OR logic to generate its output based at least in part on an initial portion of the input data and an initial seed. Example 24 includes the computer-readable medium of example 20, further comprising one or more instructions that when executed on the at least one processor configure the at least one processor to perform one or more operations to cause a last one of the plurality of exclusive OR logic to generate a cyclical redundancy check value. Example 25 includes the computer-readable medium of example 20, wherein the input data comprises 512 bytes of data or 4096 bytes of data, wherein each of a plurality of portions of the input data comprises 32 bytes, wherein at least one portion of the input data comprises less than 32 bytes.

Example 26 includes a computing system comprising: at least one network interface to communicate data input data; a plurality of exclusive OR logic comprising first exclusive OR logic and second exclusive OR logic; first Galois Field multiplier logic to multiply a first output from the first exclusive OR logic and a first portion of a plurality of portions of input data; and second Galois Field multiplier logic to multiply a second output from the second exclusive OR logic and a second portion of the plurality of portions of the input data. Example 27 includes the system of example 26, wherein the second portion of the input data is to follow the first portion of the input data. Example 28 includes the system of example 26, wherein the first exclusive OR logic is to generate the first output based at least in part on an exclusive OR operation to be performed on the first portion of the plurality of portions of the input data and a third output from a third exclusive OR logic. Example 29 includes the system of example 26, wherein an initial one of the plurality of exclusive OR logic is to generate its output based at least in part on an initial portion of the input data and an initial seed. Example 30 includes the system of example 26, wherein a last one of the plurality of exclusive OR logic is to generate a cyclical redundancy check value. Example 31 includes the system of example 26, wherein the input data is to comprise 512 bytes of data or 4096 bytes of data, wherein each of a plurality of portions of the input data is to comprise 32 bytes. Example 32 includes the system of example 26, wherein at least one network interface is to communicate at least a portion of the input data. Example 33 includes the system of example 26, wherein a processor, having one or more processor cores, is to comprise one or more of: the plurality of exclusive OR logic, first Galois Field multiplier logic, and the second Galois Field multiplier logic.

Example 34 includes an apparatus comprising means to perform a method as set forth in any preceding example.

Example 35 comprises machine-readable storage including machine-readable instructions, when executed, to implement a method or realize an apparatus as set forth in any preceding claim.

In various embodiments, the operations discussed herein, e.g., with reference to FIGS. 1-5, may be implemented as hardware (e.g., circuitry), software, firmware, microcode, or combinations thereof, which may be provided as a computer program product, e.g., including a tangible (e.g., non-transitory) machine-readable or computer-readable medium having stored thereon instructions (or software procedures) used to program a computer to perform a process discussed herein. Also, the term "logic" may include, by way of example, software, hardware, or combinations of software and hardware. The machine-readable medium may include a storage device such as those discussed with respect to FIGS. 1-5.

Additionally, such tangible computer-readable media may be downloaded as a computer program product, wherein the program may be transferred from a remote computer (e.g., a server) to a requesting computer (e.g., a client) by way of data signals (such as in a carrier wave or other propagation medium) via a communication link (e.g., a bus, a modem, or a network connection).

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments have been described in language specific to structural features, numerical values, and/or methodological acts, it is to be understood that claimed subject matter may not be limited to the specific features, numerical values, or acts described. Rather, the specific features, numerical values, and acts are disclosed as sample forms of implementing the claimed subject matter.

The invention claimed is:

1. An apparatus comprising:
a plurality of exclusive OR logic comprising first exclusive OR logic and second exclusive OR logic, wherein at least a portion of the first exclusive OR logic or the second exclusive OR logic is in hardware;
first Galois Field multiplier logic to multiply a first output from the first exclusive OR logic and a first portion of a plurality of portions of input data; and
second Galois Field multiplier logic to multiply a second output from the second exclusive OR logic and a second portion of the plurality of portions of the input data, wherein the second portion of the input data is to follow the first portion of the input data, wherein at least one of the plurality of exclusive OR logic is to generate a value to perform a cyclical redundancy check on the input data.

2. The apparatus of claim 1, wherein the first exclusive OR logic is to generate the first output based at least in part on an exclusive OR operation to be performed on the first portion of the plurality of portions of the input data and a third output from a third exclusive OR logic.

3. The apparatus of claim 2, wherein the third exclusive OR logic is to generate the third output based at least in part on an exclusive OR operation to be performed on a third portion of the input data, wherein the second portion of the input data is to follow the third portion of the input data.

4. The apparatus of claim 1, wherein an initial one of the plurality of exclusive OR logic is to generate its output based at least in part on an initial portion of the input data and an initial seed.

5. The apparatus of claim 1, wherein a last one of the plurality of exclusive OR logic is to generate a cyclical redundancy check value.

6. The apparatus of claim 1, wherein the input data is to comprise 512 bytes of data or 4096 bytes of data, wherein each of a plurality of portions of the input data is to comprise 32 bytes.

7. The apparatus of claim 6, wherein at least one portion of the input data is to comprise 1 byte or less than 32 bytes.

8. The apparatus of claim 7, comprising logic to calculate a cyclical redundancy check value for the 1 byte of the input data.

9. The apparatus of claim 1, wherein at least one network interface is to communicate at least a portion of the input data.

10. The apparatus of claim 1, wherein a processor, having one or more processor cores, is to comprise one or more of: the plurality of exclusive OR logic, first Galois Field multiplier logic, and the second Galois Field multiplier logic.

11. A method comprising:
multiplying, at first Galois Field multiplier logic, a first output from a first exclusive OR logic of a plurality of exclusive OR logic and a first portion of a plurality of portions of input data, wherein at least a portion of the first exclusive OR logic or the second exclusive OR logic is in hardware; and
multiplying, at second Galois Field multiplier logic, a second output from a second exclusive OR logic of the plurality of exclusive OR logic and a second portion of the plurality of portions of the input data, wherein the second portion of the input data is to follow the first portion of the input data wherein at least one of the plurality of exclusive OR logic generates a value to perform a cyclical redundancy check on the input data.

12. The method of claim 11, further compromising the first exclusive OR logic generating the first output based at least in part on an exclusive OR operation performed on the first portion of the plurality of portions of the input data and a third output from a third exclusive OR logic.

13. The method of claim 11, further comprising an initial one of the plurality of exclusive OR logic generating its output based at least in part on an initial portion of the input data and an initial seed.

14. The method of claim 11, further comprising a last one of the plurality of exclusive OR logic generating a cyclical redundancy check value.

15. The method of claim 11, wherein the input data comprises 512 bytes of data or 4096 bytes of data, wherein each of a plurality of portions of the input data comprises 32 bytes.

16. The method of claim 15, wherein at least one portion of the input data comprises less than 32 bytes.

17. The method of claim 16, further comprising calculating a cyclical redundancy check value for 1 byte of the input data.

18. A computer-readable medium comprising one or more instructions that when executed on at least one processor configure the at least one processor to perform one or more operations to:

multiply, at first Galois Field multiplier logic, a first output from a first exclusive OR logic of a plurality of exclusive OR logic and a first portion of a plurality of portions of input data; and
multiply, at second Galois Field multiplier logic, a second output from a second exclusive OR logic of the plurality of exclusive OR logic and a second portion of the plurality of portions of the input data, wherein the second portion of the input data is to follow the first portion of the input data wherein at least one of the plurality of exclusive OR logic generates a value to perform a cyclical redundancy check on the input data.

19. The computer-readable medium of claim 18, further comprising one or more instructions that when executed on the at least one processor configure the at least one processor to perform one or more operations to cause the first exclusive OR logic to generate the first output based at least in part on an exclusive OR operation performed on the first portion of the plurality of portions of the input data and a third output from a third exclusive OR logic.

20. The computer-readable medium of claim 18, further comprising one or more instructions that when executed on the at least one processor configure the at least one processor to perform one or more operations to cause an initial one of the plurality of exclusive OR logic to generate its output based at least in part on an initial portion of the input data and an initial seed.

21. The computer-readable medium of claim 18, further comprising one or more instructions that when executed on the at least one processor configure the at least one processor to perform one or more operations to cause a last one of the plurality of exclusive OR logic to generate a cyclical redundancy check value.

22. The computer-readable medium of claim 18, wherein the input data comprises 512 bytes of data or 4096 bytes of data, wherein each of a plurality of portions of the input data comprises 32 bytes, wherein at least one portion of the input data comprises less than 32 bytes.

23. An apparatus comprising:
a plurality of exclusive OR logic comprising first exclusive OR logic and second exclusive OR logic, wherein at least a portion of the first exclusive OR logic or the second exclusive OR logic is in hardware;
first Galois Field multiplier logic to multiply a first output from the first exclusive OR logic and a first portion of a plurality of portions of input data; and
second Galois Field multiplier logic to multiply a second output from the second exclusive OR logic and a second portion of the plurality of portions of the input data, wherein a processor, having one or more processor cores, is to comprise one or more of: the plurality of exclusive OR logic, first Galois Field multiplier logic, and the second Galois Field multiplier logic wherein at least one of the plurality of exclusive OR logic is to generate a value to perform a cyclical redundancy check on the input data.

24. The apparatus of claim 23, wherein an initial one of the plurality of exclusive OR logic is to generate its output based at least in part on an initial portion of the input data and an initial seed.

25. The apparatus of claim 23, wherein a last one of the plurality of exclusive OR logic is to generate a cyclical redundancy check value.

* * * * *